United States Patent [19]

Claramonte et al.

[11] Patent Number: 4,917,707
[45] Date of Patent: Apr. 17, 1990

[54] PROCESS, CELL AND DEVICE FOR CRYSTAL GROWTH, PARTICULARLY FOR SPACE VESSEL

[75] Inventors: Manuel P. Claramonte, Chaville; Guy M. Bonnet, Poissy; Jean-Claude Auffret, Chapet, all of France

[73] Assignee: Aerospatiale Societe Nationale Industrielle, Paris, France

[21] Appl. No.: 193,650

[22] PCT Filed: Oct. 8, 1987

[86] PCT No.: PCT/FR87/00386

§ 371 Date: Mar. 30, 1988

§ 102(e) Date: Mar. 30, 1988

[87] PCT Pub. No.: WO88/02794

PCT Pub. Date: Apr. 21, 1988

[30] Foreign Application Priority Data

Oct. 9, 1986 [FR] France .............................. 86 14056

[51] Int. Cl.$^4$ .............................................. B01D 9/02
[52] U.S. Cl. ..................................... 23/300; 156/600; 156/DIG. 62; 156/DIG. 113; 422/245; 422/248; 530/419
[58] Field of Search ................ 422/245, 248; 156/600, 156/DIG. 62, DIG. 113; 23/300; 530/427, 412, 418, 419

[56] References Cited

U.S. PATENT DOCUMENTS

| | | | |
|---|---|---|---|
| 3,788,818 | 1/1974 | Madjid | .................................. 23/300 |
| 4,263,010 | 4/1981 | Randolph | ........................... 422/245 |
| 4,755,363 | 7/1988 | Fujita et al. | ......................... 422/245 |

OTHER PUBLICATIONS

Littke, Walter et al., J. of Crystal Growth, 76 (1986), 663-672.

Primary Examiner—Melvyn J. Andrews
Attorney, Agent, or Firm—Fisher, Christen & Sabol

[57] ABSTRACT

Process of crystal growth by diffusion, particularly intended to be carried out on board a space vessel and according to which a substance (5) to be crystallized, contained in a crucible (4), is brought into presence with a precipitating agent (9) through a diffusion wall (6) obturating said crucible. According to the invention:
in a first recipient (1) is arranged said crucible (4) containing the substance to be crystallized and obturated by said wall;
said first recipient (1) is obturated by a stopper (3) of porous material;
in a second recipient (12) is arranged a porous body (19);
said first and second recipients are brought together so that said porous body and said stopper of porous material are in contact with each other; and
said precipitating agent is injected into said porous body (19) of said second recipient (12) through (15).

10 Claims, 3 Drawing Sheets

PROCESS, CELL AND DEVICE FOR CRYSTAL GROWTH, PARTICULARLY FOR SPACE VESSEL

The present invention relates to a process, a cell and a device for crystal growth, especially adapted to be employed on board a space vessel.

It is known that one of the methods of studying macromolecular substances consists in forming crystals of said substances and in subjecting said crystals to examinations, particularly spectrographic ones. In order to form such crystals, methods of diffusion through a porous diffusion wall are, inter alia, employed. To that end, in an enclosure is disposed a crucible of which the opening is covered by said wall and which is filled with a liquid mixture of a macromolecular substance to be studied and of a precipitating agent in an insufficient concentration to act, then such a precipitating agent is introduced into said enclosure either in vapour form (the porous wall may in that case merely be a net), or in liquid form (it is in that case question of dialysis and the porous wall is a membrane).

By diffusion through said porous wall, the concentration of the precipitating agent mixed with the macromolecular substance tends to be aligned on that of the precipitating agent contained in the enclosure. Consequently, by varying the concentration of this latter precipitating agent, one can act on the crystallization of said macromolecular substance. Generally, the crucible and the enclosure are at least partially transparent, with the result that an operator can visually follow the development of crystallization.

However, the crystals obtained in terrestrial laboratories by carrying out these diffusion techniques are not perfect, both in quality and in size, particularly due to the phenomena of convexion due to gravity.

In order to overcome this drawback, it would be advantageous to be able to carry out such diffusion techniques on board space vessels, since, in that case, the conditions of weightlessness eliminate these phenomena of convexion. However, an attempt at carrying out the terrestrial methods as such would encounter difficulties, if not impossibilities, due in particular to the conditions of launching space vessels and to the short life duration of certain macromolecular substances (two weeks for proteins for example). For example, taking into account the imperatives and relatively long preparation times for launching a space vessel, the macromolecular substances would be dead before crystallization in space can be attempted.

The present invention has for its principal object a process, cells and a device for crystal growth making it possible to adapt the method of diffusion to use on board a space vessel.

To that end, according to the invention, the process of crystal growth by diffusion, particularly intended to be carried out on board a space vessel and according to which a substance to be crystallized contained in a crucible is brought into presence with a precipitating agent through a diffusion wall obturating said crucible, is noteworthy:

in that, in a first recipient is arranged said crucible containing the substance to be crystallized and obturated by said wall;

in that said first recipient is obturated by a stopper of porous material;

in that, in a second recipient is arranged a porous body;

in that said first and second recipients are brought together so that said porous body and said stopper of porous material are in contact with each other; and in that said precipitating agent is injected into said porous body of said second recipient.

It is seen that, thanks to the invention, said first recipient may be independent of said second recipient, and may be placed on board the space vessel at the last moment before it is launched. It will further be noted that, after said first and second recipients are brought together, the precipitating agent, before attaining the diffusion wall of the crucible, must pass through the porous body of said second recipient and the stopper of porous material of said first recipient. Consequently, one benefits from a wide diffusion front promoting homogeneity of the mixture and therefore generating good conditions for the formation of the crystals.

The process according to the invention may be carried out by diffusion in vapour phase. In that case, before injection of said precipitating agent, the space inside said first recipient is simply filled with a gaseous medium, neutral from the standpoint of crystallization.

However, the process according to the invention may be carried out in accordance with the dialysis mode. In that case, before injection of said precipitating agent, the space inside said first recipient is completely filled with precipitating agent at an insufficient concentration to generate crystallization of said substance in the crucible, and said porous body of said second recipient is imbibed with precipitating agent, likewise at an insufficient concentration to generate crystallization of said substance.

Particularly in this latter case, in order to avoid imprisoning air between said stopper of porous material and said body at the moment of contact thereof, it is advantageous if at least said porous body is spongy in order to be compressed as soon as it comes into contact with said stopper of porous material.

Furthermore, in order to give greater suppleness to the crystallization experiments, it is preferable if different concentrations of precipitating agent can be injected into said porous body.

The present invention further relates to a cell for crystal growth by diffusion, comprising a crucible in which is contained a substance to be crystallized and which is obturated by a diffusion wall, said crucible being disposed in an enclosure capable of containing a precipitating agent. According to the invention, this cell is characterized in that it comprises:

a first recipient in which is arranged said crucible and which is obturated by a stopper of porous material; and a second open recipient containing a porous body and provided with means for conducting precipitating agent, disposed on the side opposite the opening of said second recipient with respect to said porous body.

Said first recipient may preferably fit in tight manner in said second recipient.

In an advantageous embodiment, the outer face of said porous body projects outside said second recipient, said porous body being spongy.

In that case, it is then preferable if the projecting part of said spongy porous body is surrounded by a ring sliding inside said second recipient. In this way, when the first and second recipients join, said ring is pushed inwardly of said second recipient.

Thanks to the present invention, an installation for crystal growth may therefore be produced, comprising at least one cell of the type specified hereinabove and noteworthy in that it comprises:

a fixed part comprising said second recipients, at least one source of injection of precipitating agent connected to said conducting means, and an overflow reservoir connected to said cell; and a removable part comprising said first recipients, in each of which is arranged a crucible obturated by a diffusion wall.

The figures of the accompanying drawing will clearly show how the invention may be carried out. In these figures, like references designate like elements.

The embodiments shown in FIGS. 1 to 6 are particularly intended for crystal growth by dialysis.

Figure 1:
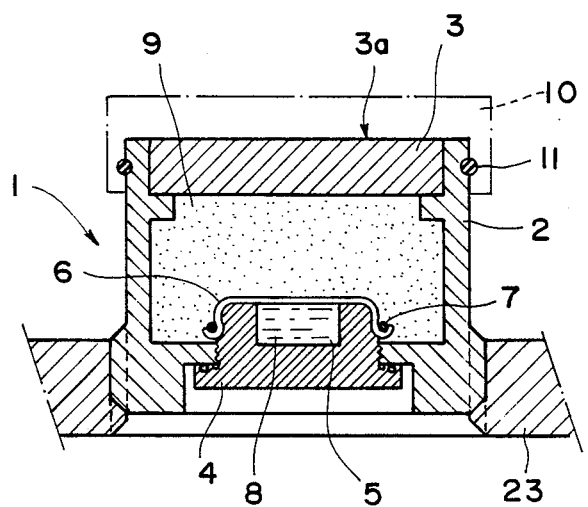
FIG. 1 is a view in section of the first recipient of an embodiment of the crystal growth cell according to the present invention.

As may be seen in FIG. 1, the first recipient 1 of crystal growth cell shown comprises a hollow body 2, for example cylindrical, of which the opening is obturated by a stopper 3 of wetting porous material, for example sintered glass of which the outer face 3a is for example plane. In the bottom of the hollow body 2 is fixed, for example by screwing in an opening in said bottom, a crucible 4 made of transparent material (for example methacrylate). The cavity 5 of the crucible 4 is obturated by a diffusion membrane 6, for example maintained by a clamping ring 7. This cavity 5 is filled with a liquid mixture 8 of a substance to be crystallized and of a precipitating agent, in an insufficient concentration to be active. Furthermore, the space inside the body 2, between the crucible 4 and the porous stopper 3, is filled with precipitating agent 9 of which the concentration is likewise less than the threshold of crystallization.

The recipient 1 is closed by a cap 10 (non-wetting) covering the porous stopper 3, a seal 11 ensuring tightness between said cap 10 and the outer wall of the hollow body 2.

Figure 2:
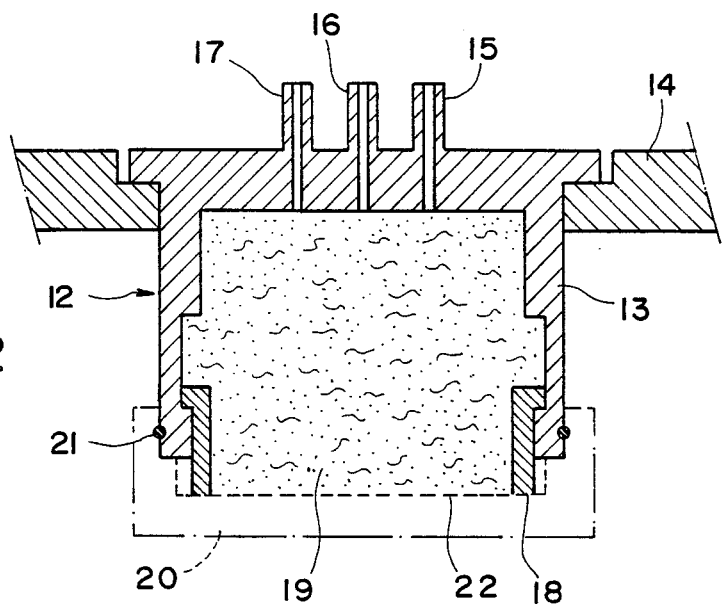
FIG. 2 is a view in section of the second recipient of an embodiment of the crystal growth cell according to the present invention.

The second recipient 12 of the crystal growth cell according to the invention, shown in FIG. 2, comprises an open hollow body 13, for example cylindrical, of which the inner diameter is slightly greater than the outer diameter of the hollow body 2 of the first recipient 1.

The hollow body 13 is fixed, by any known means, to a support 14 and is connected, for example by endpieces 15, 16 and 17 passing through its bottom, to two sources of precipitating agent of different concentrations and to an overflow reservoir. (These sources and reservoir are visible in FIGS. 5 and 6, where they bear references 26, 27 and 30).

Towards its opening, the hollow body 13 is provided with an inner sliding ring 18, projecting outwardly and prevented from becoming detached from said hollow body 13. The inner space of the recipient 12 (including the projecting part of the sliding ring 18) is filled with a pad of fibers 19 made of a highly wetting material, for example rock wool, imbibed with the precipitating agent in a concentration rendering it inactive. A cap 20, made of a non-wetting material and associated with a seal 21, hermetically obturates the open end of the hollow body 13 and of the sliding ring 18. A grating 22 obturates the ring 18 on the outer side and serves to retain the pad 19, giving it, for example, a plane outer face.

In order to constitute the crystal growth cell according to the invention, one begins by removing the caps 10 and 20 and the recipients 1 and 12 are brought closer together (cf. FIG. 3), until the edge of the recipient 2 surrounding the porous stopper 3 is in contact with the sliding ring 18. To facilitate this movement of approach, the recipient 1 may be connected to a support 23.

Figure 3:
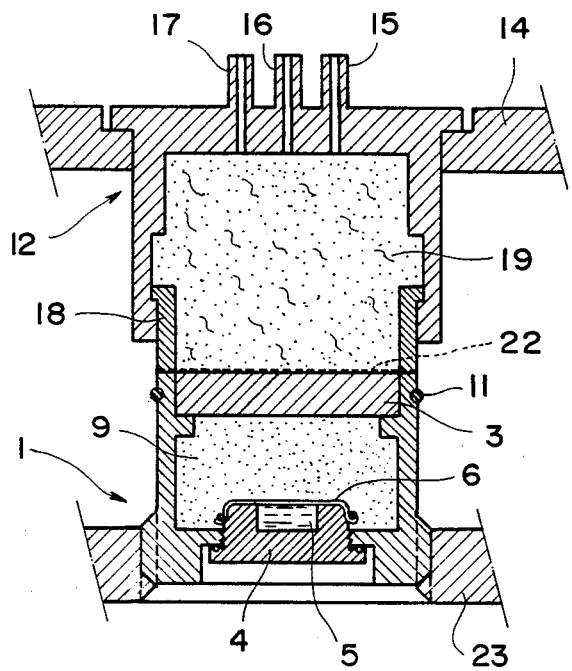
FIG. 3 illustrates the joining of the first and second recipients of FIGS. 1 and 2.

In this position of join shown in FIG. 3, the pad 19 (and its grating 22) is in contact with the porous stopper 3 and, the outer face 3a thereof and said grating 22 being plane, there is no air imprisoned between the pad 19 and the porous stopper 3.

Then, the movement of approach of the recipients 1 and 12 is continued until recipient 1 penetrates partially into recipient 12, pushing the sliding ring 18 and compressing the pad 19, with the result that liquid is driven towards the overflow 30 and there is no risk of air remaining imprisoned between the stopper 3 and the face 22 of the pad 19. When the ring 18 is in extreme recoil position (cf. FIG. 4), the seal 11 cooperates with the inner wall of the body 13 to ensure seal vis-a-vis the outside.

Figure 4:
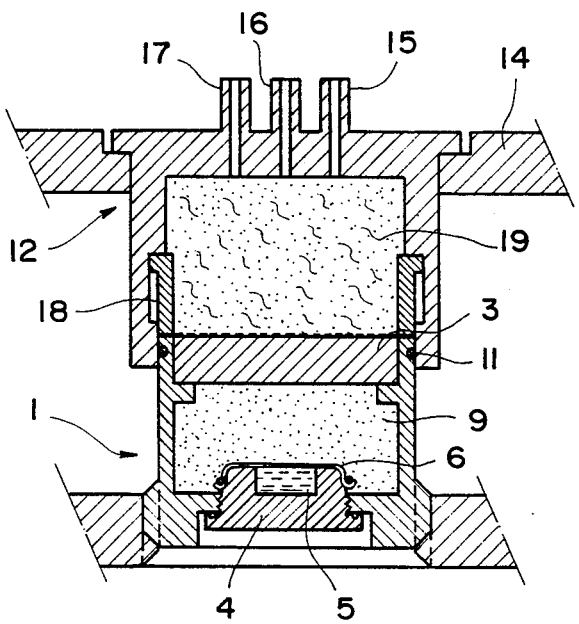
FIG. 4 illustrates the connection of said first and second recipients.
Figure 5:
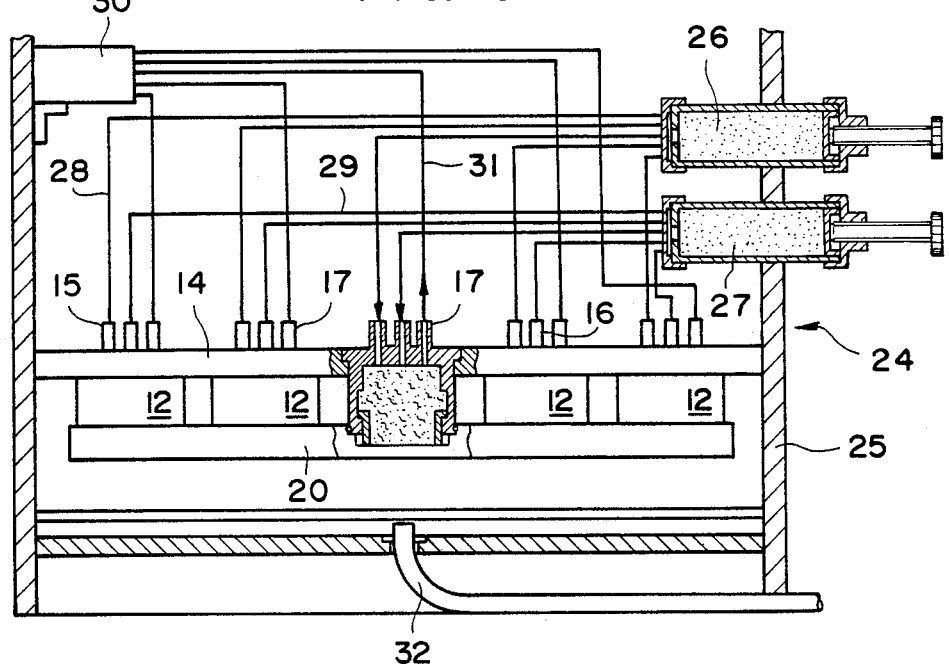
FIGS. 5 and 6 illustrate an installation for crystal growth according to the present invention, respectively before and after positioning of said first recipients.
Figure 6:
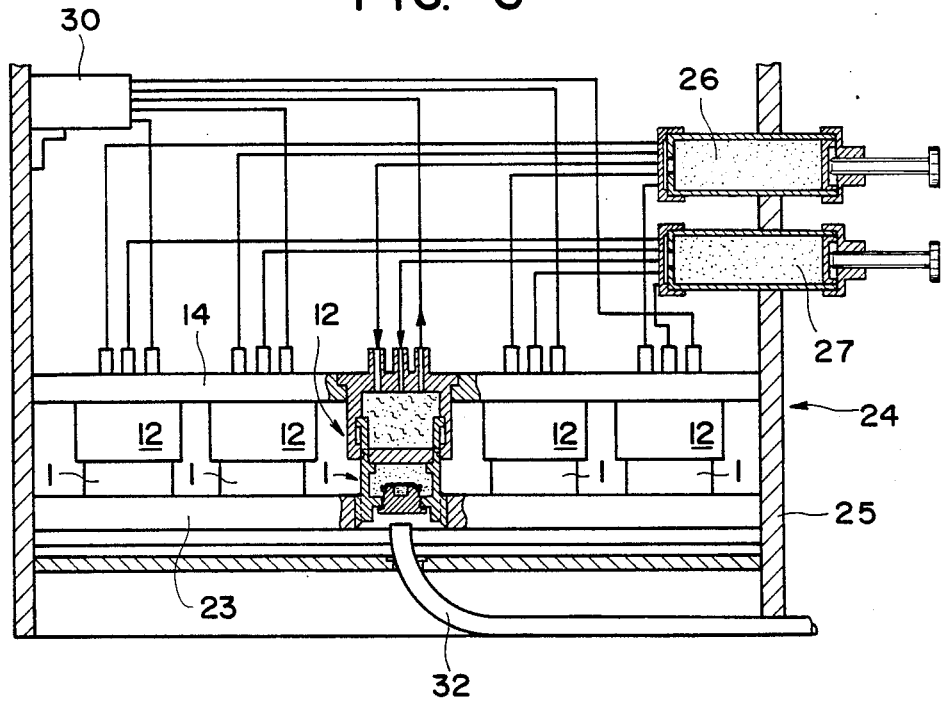

As shown in FIGS. 5 and 6, an installation 24 for crystal growth according to the invention may comprise a plurality of cells 1-12 of the type described with reference to FIGS. 1 to 4. Such an installation 24 comprises a fixed part shown in FIG. 5, which may be mounted at any opportune moment inside a space vessel, even a long time before the launching thereof.

The fixed part of the crystal growth installation 24, shown in FIG. 5, comprises a frame 25 with which a common support 14 is fast, bearing a plurality of recipients 12, obturated in common by a multiple cap 20. Moreover, the frame 25 bears two syringes 26 and 27 containing precipitating agent at different concentrations. The syringe 26 is connected to the endpieces 15 of the recipients 12 by conduits 28, whilst syringe 27 is connected to endpieces 16 of said recipients 12 by conduits 29. An overflow reservoir 30, fast with the frame 25, is connected to the endpieces 17 of the recipients 12 by conduits 31. Finally, optical fibers 32 are disposed opposite the openings of the recipients 12.

In FIG. 5 (as well as in FIGS. 2, 3 and 4), the recipients 12 are shown with their opening directed downwardly, but this arrangement is not essential for carrying out the invention on board a space vessel.

The removable part of the installation 24 is essentially constituted by a support 23, bearing a plurality of recipients 1 and adapted to be fixed (in any known manner and not shown) on the frame 25, so that each recipient 1 can lie opposite a recipient 12 and penetrate therein to take the position illustrated in FIG. 4. This mobile part 1-23 is mounted on the frame 25 only shortly before beginning the experiments.

In this way, whilst awaiting experiments, the installation 24 is in the position shown in FIG. 5. When it is desired to begin an operation of crystal growth, the removable part 1-23 is placed in position in installation 24, then, after having removed the caps 10 and 20 without taking liquid along with them, the supports 14 and 23 are brought closer together until each couple of recipients 1-12 is in the position of FIG. 4, also shown in FIG. 6. Then, by acting on one or the other of the syringes 26 and 27, or on both, the precipitating agent is injected into the recipients 12 and 1. The formation of possible crystals as well as the latter are observed through the bottoms of the crucibles 4 by the optical fibers 32, which lead to an optical or electro-optical apparatus (not shown). The excess precipitating agent is conducted into the overflow reservoir 30 via conduits 31.

It will be noted that the precipitating agent injected attains the diffusion membranes 6 only after having passed through the pads 19 of recipients 12 and the porous stoppers 3 of recipients 1. Consequently, the diffusion front extends over a large surface, with the result that the conditions of formation of the crystals are optimum. This results in crystals of excellent quality.

What is claimed is:

1. Process for growing a crystal by diffusion, comprising the following steps:
    placing a substance to be crystallized into a crucible and closing said crucible by a diffusion wall;
    placing said crucible with said substance and said diffusion wall into a first recipient;
    obturating said first recipient by a stopper of porous material;
    arranging a porous body in a second recipient;
    bringing together said first and second recipients so that said porous body and said stopper of porous material are in contact with each other;
    injecting a precipitating agent into said porous body of said second recipient; and
    growing said crystal of said substance.

2. Process according to claim 1 comprising the further step of filling the space inside of said first recipient with a gaseous medium, neutral from the standpoint of crystallization, before injecting said precipitating agent.

3. Process according to claim 1 comprising the further steps of:
    completely filling the space inside of said first recipient with a precipitating agent at an insufficient concentration to generate crystallization of said substance in the crucible, before injecting said precipitating agent; and
    imbibing said porous body of said second recipient with a precipitating agent, likewise at an insufficient concentration to generate crystallization of said substance.

4. Process according to claim 1 wherein at least said porous body is spongy in order to be compressed as soon as it comes into contact with said stopper of porous material.

5. Process according to claim 1 wherein different concentrations of precipitating agents are injected into said porous body.

6. Cell for growing a crystal by diffusion, comprising:
    a crucible for containing a substance to be crystallized;
    a first recipient containing said crucible, said first recipient being obturated by a stopper of porous material;
    a second open recipient containing a porous body and provided with means for conducting precipitating agent, disposed on the side opposite the opening of said second recipient with respect to said porous body;
    said first and second recipients being able to be joined.

7. Cell according to claim 6 wherein said first recipient fits in a tight manner in said second recipient.

8. Cell according to claim 6 or claim 7 wherein said porous body is spongy and projects partly outside of said second recipient.

9. Cell according to claim 8 wherein the projecting part of said spongy porous body is surrounded by a ring able to be retracted into said second recipient.

10. Installation for growing a crystal, comprising:
    a support for supporting:
        the second recipients of a plurality of cells as specified in claim 6;
        at least one source of injection of precipitating agent connected to said conducting means; and
        an overflow reservoir connected to said cell;
    and an assembly comprising the first recipients of said plurality of cells, a crucible obturated by a diffusion wall being disposed in each of said first recipients.

* * * * *